United States Patent [19]

Burger et al.

[11] Patent Number: 5,300,930
[45] Date of Patent: Apr. 5, 1994

[54] BINARY ENCODING METHOD WITH SUBSTANTIALLY UNIFORM RATE OF CHANGING OF THE BINARY ELEMENTS AND CORRESPONDING METHOD OF INCREMENTATION AND DECREMENTATION

[75] Inventors: M. Jacques Burger, Bieville Beuville; M. Marc Girault, Caen, both of France

[73] Assignee: France Telecom, France

[21] Appl. No.: 784,545

[22] Filed: Oct. 29, 1991

[30] Foreign Application Priority Data

Nov. 2, 1990 [FR] France .................. 90 13758

[51] Int. Cl.$^5$ .............................................. H03M 7/14
[52] U.S. Cl. ........................................ 341/96; 341/50; 341/63
[58] Field of Search ............... 341/96, 63, 97, 98, 341/50; 377/34, 26

[56] References Cited

U.S. PATENT DOCUMENTS 2,632,058  3/1953  Gray .
4,512,029  4/1985  Brice .
4,891,823  1/1990  Cole ................................ 341/81 X

FOREIGN PATENT DOCUMENTS 62-299116A  12/1987  Japan .
2171543A    7/1986   United Kingdom .
2180083A    3/1987   United Kingdom .

OTHER PUBLICATIONS

Bennett and Davey, Data Transmission, pp. 115–118, 201–203 and 219–220 (1965).

*Primary Examiner*—Sharon D. Logan
*Attorney, Agent, or Firm*—Locke Reynolds

[57] ABSTRACT

A binary encoding method notably but not exclusively for the encoding of data elements designed to be represented sequentially, according to a preestablished order, for example in counters, inducing a uniform or substantially uniform mean changing rate for each of the binary elements, the data elements being encoded on two distinct fields of binary elements, a reference field and a permutation field, and the sequence of binary elements assigned to the permutation field undergoing a permutation as a function of the value contained in the reference field.

24 Claims, 1 Drawing Sheet

BINARY ENCODING METHOD WITH SUBSTANTIALLY UNIFORM RATE OF CHANGING OF THE BINARY ELEMENTS AND CORRESPONDING METHOD OF INCREMENTATION AND DECREMENTATION

BACKGROUND OF THE INVENTION

1. Field of the Invention

The field of the invention is that of binary encoding, namely the representation of data of any nature by means of binary elements 0 or 1.

The invention relates notably but not exclusively to the encoding of data designed to be shown sequentially in a pre-established order.

More generally, the invention can be applied in a preferred way when it is necessary to encode data elements which, on an average, appear a substantially equal number of times.

A particular example of application is thus the encoding of a counter for which the data elements to be encoded are integers or whole numbers from 0 to n−1. Besides, counters can always be reduced to this case since, for this purpose, it is enough to number the data elements to be represented from 0 to n−1 in the order in which they appear. The invention can be applied both to simple, systematically incremented counters and to counters that can be sometimes incremented and sometimes decremented.

The invention can be used notably when implementing memories of the type sensitive to wear. This is the case, for example, of E2PROM memories such as those contained in microprocessor cards.

However, it is clear that the invention can be applied to the encoding of any type of data, irrespectively of the type of system and/or data processing and storage media used.

2. Field of the Invention

There are already many known methods for the binary encoding of whole numbers. The method most frequently used consists in representing this whole number by its binary decomposition into a number system using base two. This method is often known as standard binary encoding or natural binary encoding. In another well-known method, each digit of the decomposition of this whole number, in a system using base ten, is represented by the decomposition of this digit into a number system using base two. Four binary elements are then needed to encode each digit of the decomposition in the base ten system. There are again several types of binary encodings, corresponding to specific applications or needs.

Thus, in certain applications, it is desirable that the encoding method used should be such that when changing from one whole number to the next whole number, or to the preceding whole number, the number of binary elements that change value is as small as possible on an average, the ideal being 1. Standard binary encoding falls far short of this ideal, since the average number is equal to about 2.

Satisfactory approaches to this minimum change constraint have long existed. These approaches are known as minimum-change codes and are described, for example, in W. R. Bennet & J. R. Davey, *Data Transmission*, New York, McGraw Hill, 1965. The Gray codes constitute a particular example of minimum-change codes. They are notably described in the U.S. patent published on Mar. 17 1953 under No. 2,632,058.

The Gray codes have proved to be particularly valuable and are much used owing to the simplicity of their construction and the simplicity of the conversions between these codes and the standard binary code and because the number of binary elements used is equal to the number of binary elements used in the standard binary encoding, said number being as small as possible.

However, it is sometimes also desirable for all the binary elements to change value, on an average, as much as one another, i.e. it is desirable for the change to be uniform. Gray encoding does not have this property since a binary element of low significance changes a number of times equal to half the whole numbers to be encoded at each cycle of a counter while the binary element of high significance changes only once.

The constraint of uniform changing of the binary elements arises, for example, in a crucial way in the case of E2PROM type memories. For, in these memories, since the number of instances of changing possible for each binary element is limited (for example it is in the range of some thousands) it is advantageous to distribute the changings homogeneously among all the binary elements, thus enabling the lifetime of the components to be prolonged.

There is no encoding that is truly effective with respect to this particular constraint.

SUMMARY OF THE INVENTION

The invention is notably designed to overcome this drawback.

More precisely, the invention is aimed at providing a method for the binary encoding of digital data inducing a uniform or substantially uniform mean change rate for each of the binary elements.

A complementary aim of the invention is to provide an encoding method such as this inducing a minimum number, namely a number close to or equal to 1, of changes of binary elements during the change from one value to its successor and/or to its predecessor.

Thus, in the case of a counter, an aim of the invention, in particular, is to provide an encoding method such as this wherein the number of changes undergone by the binary element that has jumped most, when the counter has been through its cycle once or a whole number of times, is little more than the minimum number possible, i.e. for each cycle of the counter, little more than the number of integers to be encoded divided by the number of binary elements used.

In other words, one of the aims of the invention is to provide a method which, in a practically optimal way, meets the two constraints of minimum change and uniform change.

Another aim of the invention is to provide an encoding method such as this, using a number of binary elements that is equal to or, in one variant of the invention little more than, the number of binary elements used in the standard binary encoding. This characteristic proves to be essential, especially when the system used is limited in terms of memory space.

A particular aim of the invention is to provide an encoding method such at this, that can be used for the encoding of data in memories of a type sensitive to wear, such as the E2PROM in applications such as microprocessor cards. In this case, the invention enables the lifetime of the memories to be maximized.

According to a first variant, the invention is aimed at providing an encoding method such as this, with an even smaller number of changes, at the cost of a slight increase in the number of binary elements.

According to another variant, an aim of the invention is to provide an encoding method such as this, more specifically designed for the sequences of data that are to go through several cycles.

In a complementary way, another aim of the invention is to provide methods for the incrementation and decrementation of a sequence of data that does not require a full decoding of the initial data element.

Another aim of the invention is to provide methods such as these for encoding, incrementation and decrementation that require no complicated computations and implement logic means, with a view as much to simplication as to speed.

These aims, as well as others that shall appear hereinafter are achieved, according to the invention, by means of a method for the binary encoding of digital data elements wherein said data elements are encoded on two distinct fields of binary elements, a reference field and a permutation field, the sequence of binary data elements assigned to said permutation field undergoing a permutation as a function of the value contained in said reference field.

These permutations make it possible, in the permutation field, to cause the position of the binary elements that change frequently to vary with that of the elements that change little, so as to homogenize, on an average, the changes on the entire field.

In an advantageous embodiment of the invention, said permutation is a rotation, the amplitude of which is a function of the value contained in said reference field.

This provides, in particular, for a simple implementation of the invention by means of known techniques of rotation of binary sequences.

Preferably, said permutation is computed so as to provide for a substantially uniform mean change rate for each of the constituent binary elements of said permutation field.

Thus, for example, a regular rotation of the permutation field, as a function of the changes undergone by a counter, enables the assigning successively, to each physical binary element of the field, of all the binary logic elements, from the one changing most frequently to that changing least frequently. Thus, on an average, a substantially uniform change rate is obtained for each of the physical binary elements.

By contrast, the uniform change rate is not necessarily adhered to in the permutation field. However, this proves to be of little importance, since the binary elements of this field change very rarely as compared with those of a permutation field.

In the case of a method such as this applied to the encoding of n distinct data elements, said reference and permutation fields respectively comprising q and r binary elements, the total number of binary elements (q+r) is preferably equal to or greater than the number of binary elements needed for the encoding of said n distinct data elements according to the natural binary code.

For, the method according to the invention does not require more binary elements that is the case with standard binary encoding, i.e. it does not require more than the minimum. However, in certain variants, it may be worthwhile to use a greater number of binary elements, as shall be seen hereinafter.

It is moreover advantageous to meet the equality $r=2^q$ or at least the inequality $r \leq 2^q$.

The size of the reference field is chosen so that it is not too great, the property of uniform changing occurring only in the permutation field.

Advantageously, the encoding of a value N comprises the following steps:

the determining of the values Q and R corresponding respectively to the quotient and to the rest of the Euclidian division of said value N by the number $n_R$ of distinct values that it is possible to encode in said permutation field;

the assigning, to said reference field, of a first sequence of binary elements corresponding to said value Q, according to a first encoding logic;

the assigning, to said permutation field, of a second sequence of binary elements, corresponding to said value R, according to a second encoding logic;

the permutation, depending on said value Q, of said second sequence of binary elements in said permutation field.

In a particularly simple and efficient embodiment of the invention, said permutation is a rotation with an amplitude Q or, more generally, with an amplitude $A_Q$ as a function of the value Q.

The invention proves to be particularly advantageous when said digital data elements to be encoded form a finite sequence of values changing sequentially.

For, in this case, it is possible to obtain a uniform change rate at each cycle of the sequence or, as shall be seen further below, when the sequence has been through its cycle for a fixed number of times.

Preferably, at least the second encoding logic induces the changing of a minimum number of binary elements in the corresponding field during the passage from one of said data elements to the next and/or preceding data element.

It may be, for example, a Gray code.

Thus, the invention simultaneously meets the two constraints of uniform change and minimum change.

In one variant of the invention, said second encoding logic comprises the following steps:

the association of a sequence of binary elements with said value R;

the concatenation, with said sequence of binary values, of at least one binary element of a fixed value. –

In this way, the change rate of each binary element is further reduced. For, the binary element or elements of fixed values are successively assigned to each location of the permutation field. As long as the reference field does not change, this location therefore does not undergo any change. By contrast, this encoding method calls for more physical binary elements than does the natural binary encoding.

According to another variant of the invention, of the type applied to the encoding of a sequence of data designed to go through several cycles, said reference field contains a sequence of binary elements corresponding to the number of cycles undergone by said sequence, and wherein said permutation field contains a sequence of binary elements corresponding to the current data element of the sequence.

In the latter case, the method may advantageously include a step for the zero-setting and/or interruption of said sequence, performing the incrementation of the value contained in said reference field, and the assigning to said permutation field of the sequence of binary elements corresponding to the first data element of said sequence.

To go from one value to the next one, the encoding method of the invention does not dictate the decoding of the initial whole number and then the recoding of the successor or predecessor according to the principles described.

For, the invention also relates to a method for the incrementation of a sequence of data encoded according to the method described here above, comprising the following steps:

the determination of said value Q contained in said reference field, according to said first encoding logic;

the performing of a decoding permutation, depending on said value Q, of said sequence of binary elements contained in said permutation field, that is the reverse of the encoding permutation;

the incrementation, according to said second encoding logic, of the sequence of binary elements obtained after said permutation;

if the value, according to said second encoding logic of the incremented sequence of binary elements, corresponds to the first data element of said sequence, the incrementation according to said first encoding logic of the sequence of binary elements contained in said reference field and the determination of the corresponding value Q;

the performing of a decoding permutation, depending on said value Q, of said incremented sequence of binary values contained in said permutation field.

Symmetrically, the invention presents a method for the decrementation of a sequence of data elements encoded according to the above-mentioned method, comprising the following steps:

the determination of the value Q, contained in said reference field, according to said first encoding logic;

the performing of a decoding permutation, depending on said value Q, of said sequence of binary elements contained in said permutation field, that is the reverse of the encoding permutation;

the decrementation, according to said second encoding logic, of the sequence of binary elements obtained after said permutation;

if the value according to said second encoding logic of the decremented sequence of binary elements corresponds to the last data element of said sequence, the decrementation according to said first encoding logic of the sequence of binary elements contained in said reference field, and the determination of the corresponding value Q;

the performing of an encoding permutation, depending on said value Q, of said decremented sequence of binary values contained in said permutation field.

BRIEF DESCRIPTION OF THE DRAWINGS

Other characteristics and advantages of the invention shall appear from the following description of a preferred embodiment of the invention, given by way of a non-restrictive illustration, and from the appended drawings, of which.

DETAILED DESCRIPTION OF THE INVENTION

The encoding method according to the invention is notably designed to reduce the average number of changes of each binary element of a code in homogeneously distributing the changes on each of the binary elements.

To this end, a standard code is used. This is advantageously a minimum-change type of code. Then, permutations are carried out on the value obtained, as a function of a reference value.

In the embodiment described, these permutations are rotations. However, it can be clearly seen that any other type of permutation may be used, provided that it provides for a homogeneous average distribution of the changes.

Figure 1:
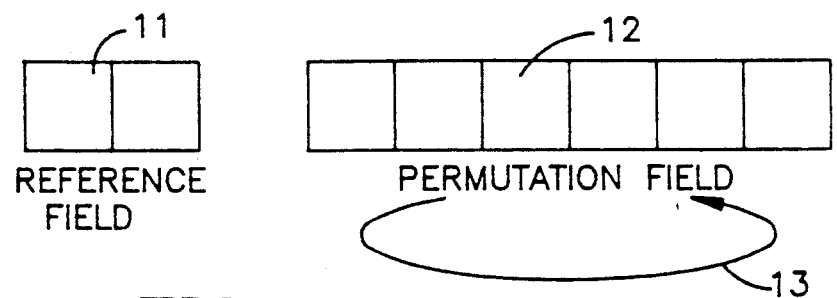
FIG. 1 presents the basic principle of the invention, relying on the decomposition of the encoding into two distinct fields, and the carrying out of permutation on one of these fields.

FIG. 1 illustrates the principle of the invention.

The encoding of a value is done on two distinct fields, a reference field 11 and a permutation field 12. As shall be seen hereinafter, the uniform change constraint is not verified except for the permutation field 12. However, this has no effect since the binary elements of the reference field 11 are intended to vary only very rarely.

In a simplified way, the encoding takes place in three stages. First of all, the value to be encoded in the reference field 11 and then the value to be encoded in the permutation field 12 are determined. Finally, a rotation 13 of the permutation field 12 is carried out, the amplitude of this rotation being a function of the value contained in the reference field 11. It is the application of these rotations that provides for the uniformity of the changes.

Figure 2:
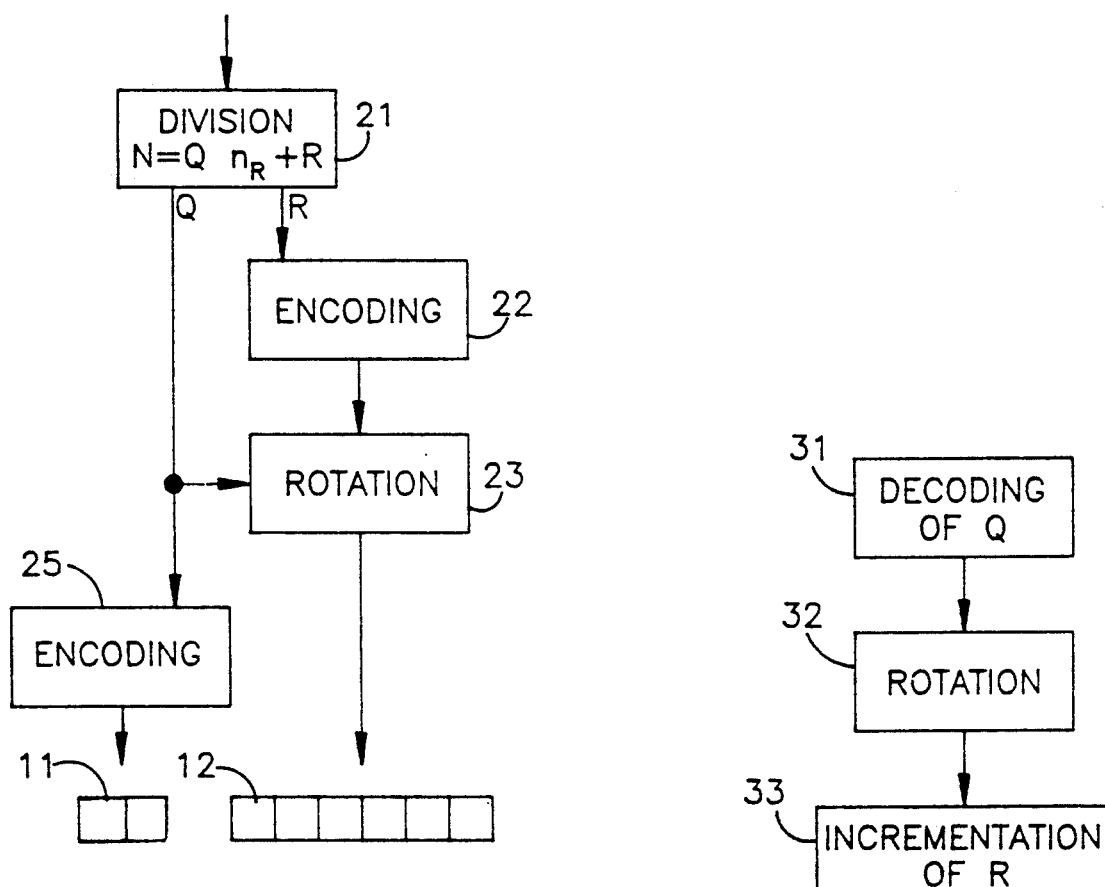
FIG. 2 is a diagram illustrating the method for the encoding of a value according to the principle shown in FIG. 1.

FIG. 2 shows a mode of encoding according to the invention.

The encoding of a whole number N is considered. The procedure begins with the Euclidean division 21 of the whole number N by the number $n_R$ of the distinct values that can be encoded in the permutation field. Thus two values Q and R are obtained, corresponding to the quotient and to the rest or remainder of the division ($N = Q.n_R + R$).

The value R is encoded in an encoding module 22 according to a chosen encoding logic, for example a Gray encoding. The binary sequence obtained then undergoes a rotation 23, the amplitude of which is a function of the value Q. In a particular embodiment, described more precisely hereinafter, this rotation 23 has an amplitude Q. However, it can be clearly seen that many other functions associating an amplitude $A_Q$ with the value Q may be used, and give an equivalent result. The binary sequence obtained after rotation is assigned to the permutation field 12.

In the same way, the value Q is encoded in an encoding module 25 according to a second encoding logic and then assigned to the reference field 11.

It must be noted that the two encoding logics may be of any known type. They may or may not be identical. Advantageously, at least for the permutation field, a minimum-change code is chosen.

Before giving a more particular description of a particular embodiment of the invention implementing the Gray encoding method, we shall briefly recall the principle of this encoding method.

Gray Encoding

Here below, we give a definition of the Gray codes, the methods of conversion between Gray encoding and standard binary encoding as well as a method of incrementation and decrementation. Other definitions and methods exists, and are equivalent to these.

The present description shall be limited to Gray codes on s bits, written as $G_s$, where s is a positive whole number. The bit by bit exclusive-OR operation is written as XOR.

The Gray code on s bits, written as $G_s$, is the function which, for any whole number ranging from 0 to $2^s-1$ and with decomposition in a system using base two equal to $h_s h_{s-1} \ldots h_1$ associates the whole number, the base two decomposition of which is the field of binary elements $g_s g_{s-1} \ldots g_1$ defined by:

$$g_s = h_s$$
$$g_{s-1} = h_{s-1} \text{ XOR } h_s$$
$$g_{s-2} = H_{s-2} \text{ XOR } h_{s-1}$$
$$\cdot$$
$$\cdot$$
$$\cdot$$
$$g_1 = h_1 \text{ XOR } h_2$$

The reverse function (Gray decoding on s bits) is then the function which associates, with the field $g_s g_{s-1} \ldots g_1$, the field $h_s h_{s-1} \ldots h_1$ defined by:

$$h_s = g_s$$
$$h_{s-1} = g_{s-1} \text{ XOR } g_s$$
$$h_{s-2} = g_{s-2} \text{ XOR } g_{s-1} \text{ XOR } g_s$$
$$\cdot$$
$$\cdot$$
$$\cdot$$
$$h_1 = g_1 \text{ XOR } g_2 \text{ XOR } \ldots g_s$$

The incrementation function of a Gray code on s bits, written $\text{Incr}_s$, is the function which associates, with the encoding $G(x) = g_s g_{s-1} \ldots g_1$ of a whole number x ranging from 0 to $2^s-1$, the $G(x+1)$ encoding of the whole number succeeding x, it being understood that $x+1$ designates the whole number 0 when $x=2^s-1$. The function $\text{Incr}_s$ obeys the following rule:

---
If $g_1$ XOR $g_2$ XOR ... XOR $g_s$ = 0, then change $g_1$
If not, and if $g_1$ = 1, then change $g_2$
If not, and if $g_2$ = 1, then change $g_3$
... If not, and if $g_{s-2}$ = 1, then change $g_{s-1}$
If not, change $g_s$
---

The decrementation function of a Gray code on s bits, written $\text{Decr}_s$, is the function which associates, with the encoding $G(x) = g_s g_{s-1} \ldots g_1$ of a whole number x ranging from 0 to $2^s-1$, the $G(x-1)$ encoding of the whole number preceding x, it being understood that $x-1$ designates the whole number $2^s-1$ when $x=0$. The function $\text{Decr}_s$ obeys the following rule:

---
If $g_1$ XOR $g_2$ XOR ... XOR $g_s$ = 1, then change $g_1$
If not, and if $g_1$ = 1, then change $g_2$
If not, and if $g_2$ = 1, then change $g_3$
... If not, and if $g_{s-2}$ = 1, then change $g_{s-1}$
If not, change $g_s$
---

Example of the encoding of a counter

Let $X = \{0, 1, 2 \ldots, n-1\}$ an interval of n whole numbers called a counter and designed to go through cycles sequentially one or more times. In the latter case, 0 shall be considered to be the successor of $n-1$.

The embodiment described below corresponds to a case where n is a power of $2 (n=2^k)$. However, every operation can be reduced to this case in replacing n by the smallest whole number having the form $2^k$ which is greater than or equal to it.

Each whole number x is encoded by means of a field C(x) of k binary elements (as in the case of standard binary encoding0 called an x code or encoding. This field is subdivided into two sub-fields: a so-called reference field, constituted by q bits, and a so-called permutation field, constituted by r bits and located to the right of the permutation field, as shown in FIG. 1. We therefore have $k = q + r$.

In an advantageous embodiment of this invention, we have the equality $r = 2^q$. We then have $k = 2^q + q$. Thus, when $q = 1, 2, 3, 4, 5 \ldots$, then $k = 3, 6, 11, 20, 37, \ldots$ and $n = 8, 64, 2048, 2^{20}, 2^{37} \ldots$ As a rule, it is advantageous to choose q as a small value and such that $2^q \leq k - q$.

It will be noted that, while the value of q should be small, it is not necessarily a good thing to choose the smallest possible value for it. For, it is easy to construct examples where the smallest value is not necessarily the best one. For example, if $q + r = 36$, uniformity is better ensured by taking $q = 6$ rather than $q = 5$.

The notation $G_s$ is given to the function which associates its Gray code on s bits with a whole number ranging from 0 to $2^s - 1$, $\text{Incr}_s$ (and $\text{Decr}_s$ respectively) to the function of incrementation (and decrementation respectively), namely the function which associates, with the Gray encoding of a whole number ranging from 0 to $2^s - 1$, the Gray encoding of its successor (or predecessor respectively) as defined here above.

The notation $C_q$ is given to any encoding function which associates a field of q bits with a whole number ranging from 0 to $2^q - 1$, and vice versa. Thus $C_q$ may be the standard binary encoding on q bits or, again, $C_q$ may be the Gray encoding on q bits $G_q$.

The counter is divided into $2^q$ intervals $I_j$ of equal length. This length is equal to $2^r$.

To encode an element x of $I_0$ which is the interval of the whole numbers ranging from 0 to $2^r - 1$, the reference field is taken as being equal to $C_q(0)$ and the permutation field as being equal to $G_r(x)$.

To encode an element x of $I_1$ which is the interval of the whole numbers ranging from $2^r$ to $2.2^r - 1$, the reference field is taken as being equal to $C_q(1)$ and the permutation field as being equal to $G_r(x - 2^r)$.

It will be noted that the standard binary encoding of $x - 2^r$ is none other than the field constituted by the r less significant bits of the standard binary encoding of x. Then, a leftward rotation with an amplitude of 1 is applied to the permutation field, i.e. if the permutation field was equal to $g_r g_{r-1} \ldots g_1$ before the rotation, it becomes $g_{r-1} \ldots g_1 g_r$ after the rotation.

More generally, to encode an element x of $I_j$, the reference field is taken as being equal to $C_q(j)$ and the permutation field as being equal to $G_r(x - j.2^r)$. The standard binary encoding of $x - j.2^r$ is therefore none other than the field constituted by r bits of the standard vinary encoding of x. Then, a leftward rotation with an amplitude j is applied to the permutation field, i.e. if the permutation field was equal to $g_r g_{r-1} \ldots g_1$ before the rotation, it becomes $g_{r-j} \ldots g_1 g_r \ldots g_{r-j+1}$ after the rotation. If j is greater than or equal to 1, then j will be replaced beforehand by the rest of the division of j by r.

Should $C_q$ be the standard binary encoding on q bits, then the method of conversion between the standard binary encoding and the encoding just defined is particularly simple. For, it suffices to preserve the q more significant bits of the standard binary encoding of x (these q bits are equal to the standard binary encoding of j), to convert the r remaining bits by a Gray encoding $G_r$, then to apply a leftward rotation with an amplitude j to the permutation field.

Another advantageous possibility consists in taking the Gray encoding $G_q$ for $C_q$.

As an example, we present the case where n=64, k=5 and q=2 and where $C_2$ is the standard binary encoding on two bits. Let $h_6 h_5 h_4 h_3 h_2 h_1$ be the binary decomposition of a whole number x, j the whole number the binary decomposition of which is $h_6 h_5$, x' the whole number the binary decomposition of which is $h_4 h_3 h_2 h_1$. The reference field is then taken as being equal to $h_6 h_5$. The permutation field is obtained by applying a leftward rotation with an amplitude j to G(x').

We then obtain the following table:

TABLE 1

| x | standard binary encoding | encoding according to the invention |
|---|---|---|
| 0 | 000000 | 000000 |
| 1 | 000001 | 000001 |
| 2 | 000010 | 000011 |
| . | . | . |
| . | . | . |
| . | . | . |
| 15 | 001111 | 001000 |
| 16 | 010000 | 010000 |
| 17 | 010001 | 010010 |
| 18 | 010010 | 010110 |
| . | . | . |
| . | . | . |
| . | . | . |
| 31 | 011111 | 010001 |
| 32 | 100000 | 100000 |
| 33 | 100001 | 100100 |
| 34 | 100010 | 101100 |
| . | . | . |
| . | . | . |
| 62 | 111110 | 111100 |
| 63 | 111111 | 110100 |

To decode a whole number encoded by the method that has just been described, the procedure starts with a decoding of the reference field. This gives a whole number j. Then, a rightward rotation with a length j is applied to the permutation field. Finally, a Gray decoding is carried out on r bits of the permutation field, and this gives a whole number x'. The whole number sought is then equal to $x' + j.2^r$.

Considering the above example (Table 1), if it is desired to decode the code constituted by the bits '101000', the procedure starts with the decoding of the reference field, equal to '10', which gives j=2. A rightward rotation with a length 2 is then applied to the permutation field, equal to '1000', which gives '0010'. This field is then decoded according to a Gray code on four bits, which gives y=3. The whole number encoded by the initial counting field was therefore $3 + 2.2^4 = 35$. The standard binary decomposition $h_6 h_5 h_4 h_3 h_2 h_1$ of this whole number is obtained by preserving the two more significant bits, namely '10' in applying a conversion from the Gray code into the standard binary code to the field '0010', which gives '0011' or '100011' in all.

According to this method, it is really ascertained that, when going from one whole number to the whole number that succeeds it, only one binary element changes its value in the permutation field. Exceptionally, a binary element also changes in the reference field. Furthermore, when the counter has gone through a full cycle, the binary elements of the permutation field have all roughly changed an equal number of times with respect to one another. The reference field elements, for their part, have changed very few times.

Incrementation of the Counter

Figure 3:
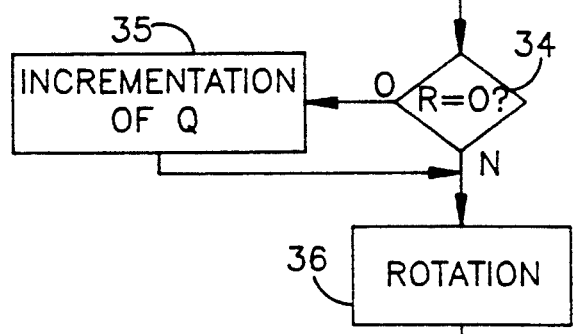
FIG. 3 illustrates a method of incrementation of a sequence of data encoded according to the method of FIG. 2.

To go from the code of one whole number to the code of the succeeding whole number, i.e. to increment the counter, it is neither necessary nor even desirable to decode the initial whole number and then encode the succeeding whole number. In fact, it suffices to apply the following method, presented with reference to FIG. 3.

First of all, the decoding 31 of the value Q contained in the reference field is performed. Then a rotation 32 with an amplitude $A_Q$, which is a function of the value Q, is performed on the binary sequence contained in the permutation field in the direction contrary to the encoding direction. Thus there is obtained, in the permutation field, the encoded sequence corresponding to the value R which it is not necessary to decode.

For, it is enough to increment (33) this sequence according to the encoding logic chosen for the permutation field. There are then two possibilities, depending on whether the test 34 indicates that the new value R corresponding to the incremented sequence is zero or that it is not zero.

If R is not zero, it is enough to carry out a new rotation 36 with an amplitude $A_Q$ on this sequence, in the direction of the encoding, to obtain the sequence to be assigned to the permutation field. The reference field remains unchanged.

By contrast, if the value R has become equal to 0, then it is necessary to carry out the incrementation 35 of the value Q according to the encoding logic used for the reference field. Then a rotation 36 is performed on the reference field, with an amplitude $A_Q$, which is a function of the new value Q.

It can be clearly seen that the incrementation method works in an equivalent way when the rotations are replaced by any permutations. In the same way, it must be noted that the encoding logics used for the two fields may be any logics, identical or not identical.

In the encoding example described here above, the rotation has an amplitude Q. The incrementation method is then more precisely the following.

The method starts with the decoding of the reference field. This gives a whole number j. Then a rightward rotation with an amplitude j is applied to the permutation field, the bits of which become $g_r \ldots g_1$. then the function $Incr_r$ (described here above) is applied to this field. Finally, a leftward rotation with an amplitude j is applied to the permutation field. Furthermore, if the function $Incr_r$ has had the effect of changing $g_r$ from 1 to 0, then the reference field is incremented and an additional leftward rotation with an amplitude 1 is applied to the permutation field. The incrementation of the reference field is not described herein since it depends on the encoding $C_q$ used.

Decrementation of the Counter

The principle of decrementation of a counter is symmetrical with that of the incrementation. It shall not be specified here except with reference to the particular case corresponding to the embodiment described in detail.

The method starts with the decoding of the reference field. This gives a whole number j. Then a rightward rotation with an amplitude j is applied to the permutation field, the bits of which become $g_r \ldots g_1$. then the function $Decr_r$ is applied to this field. Finally, a leftward rotation with an amplitude j is applied to the permutation field. Furthermore, if the function $Decr_r$ has had the effect of changing $g_r$ from 0 to 1, then the reference field is decremented and an additional rightward rotation with an amplitude 1 is applied to the permutation field. The decrementation of the reference field is not described herein since it depends on the encoding $C_q$ used.

First variant of the Invention

In a first variant of the invention, the total number of bits of the code is increased slightly so as to further reduce the number of changes in the permutation field.

This variation is described here below with reference to a case where n is a power of 2 ($n=2^k$). Every operation can be reduced to this case in replacing n by the smallest whole number having the form $2^k$ which is greater than or equal to it.

Each whole number x is encoded by means of a field C(x) of k+p binary elements called an x code or encoding. This field is subdivided into two sub-fields: a so-called reference field, constituted by q bits, and a so-called permutation field, constituted by r bits and located to the right of the permutation field. We therefore have k=q+r.

In an advantageous use of this invention, we have the equality $p+r=2^q$. We then have $k=2^q+q-p$. Thus, when q=3 and p=1, k=10 and n=1024. It will be noted that when p=0, the basic invention is returned to.

The two essential characteristics of this variants are the same as for the basic invention with the change rate being, however, smaller. The notations are also the same.

The counter is divided into $2^q$ intervals $I_j$ of equal length. This length is equal to $2^r$.

To encode an element x of $I_0$ which is the interval of the whole numbers ranging from 0 to $2^r-1$, the reference field is taken as being equal to $C_q(0)$, and the permutation field equal to $0_p | \; |G_r(x)$ where $0_p$ designates a field of p bits all equal to 0, and where $| \; |$ is the symbol of concatenation of fields of binary elements.

More generally, $0_p$ may be replaced by any fixed configuration of bits.

To encode an element x of $I_1$ which is the interval of the whole numbers ranging from $2^r$ to $2.2^r-1$, the reference field is taken as being equal to $C_q(1)$ and the permutation field as being equal to $0_p G_r | \; |(x-2^r)$. Then, a leftward rotation with an amplitude of 1 is applied to the permutation field, i.e. if the permutation field was equal to $g_{r+p}g_{r+p-1} \ldots g_1$ before the rotation, it becomes $g_{r+p-1} \ldots g_1 g_{r+p}$ after the rotation.

More generally, to encode an element x of $I_j$, the reference field is taken as being equal to $C_q(j)$ and the permutation field as being equal to $0_p | \; |G_r(x-j.2^r)$. Then, a leftward rotation with an amplitude j is applied to the permutation field, i.e. if the permutation field was equal to $g_{r+p}g_{r+p-1} \ldots g_1$ before the rotation, it becomes $g_{r+p-j} \ldots g_1 g_{r+p} \ldots g_{r+p-j+1}$ after the rotation. If j is greater than or equal to p+r, then j will be replaced beforehand by the rest of the division of j by p+r.

Should $C_q$ be the standard binary encoding on q bits, then the method of conversion between the standard binary encoding and the encoding just defined is particularly simple. For, it suffices to preserve the q more significant bits of the standard binary encoding of x (these q bits are equal to the standard binary encoding of j), to convert the r remaining bits by a Gray encoding $G_r$, cause the r resulting bits to be preceded by p bits equal to 0, and then apply a leftward rotation with an amplitude j to this field of p+r bits.

Another advantageous choice consists in taking the Gray encoding $G_q$ for $C_q$.

As an example, we present the case where n=16, k=4, q=2 and p=2 and where $C_2$ is the standard binary encoding on two bits. Let $h_4h_3h_2h_1$ be the binary decomposition of a whole number x, j the whole number the binary decomposition of which is $h_4h_3$, x' the whole number the binary decomposition of which is $h_2h_1$. The reference field is then taken as being equal to $h_4h_3$. The permutation field is obtained by applying a leftward rotation with an amplitude j to G(x').

We thus obtain the following table:

TABLE 2

| x | standard binary encoding | encoding according to the first variant |
|---|---|---|
| 0 | 0 0 0 0 | 0 0 0 0 0 0 |
| 1 | 0 0 0 1 | 0 0 0 0 0 1 |
| 2 | 0 0 1 0 | 0 0 0 0 1 1 |
| 3 | 0 0 1 1 | 0 0 0 0 1 0 |
| 4 | 0 1 0 0 | 0 1 0 0 0 0 |
| 5 | 0 1 0 1 | 0 1 0 0 1 0 |
| 6 | 0 1 1 0 | 0 1 0 1 1 0 |
| 7 | 0 1 1 1 | 0 1 0 1 0 0 |
| 8 | 1 0 0 0 | 1 0 0 0 0 0 |
| 9 | 1 0 0 1 | 1 0 0 1 0 0 |
| 10 | 1 0 1 0 | 1 0 1 1 0 0 |
| 11 | 1 0 1 1 | 1 0 1 0 0 1 |
| 12 | 1 1 0 0 | 1 1 0 0 0 0 |
| 13 | 1 1 0 1 | 1 1 1 0 0 0 |
| 14 | 1 1 1 0 | 1 1 1 0 0 1 |
| 15 | 1 1 1 1 | 1 1 0 0 0 1 |

To decode a whole number encoded by the method that has just been described, the procedure starts with a decoding of the reference field. This gives a whole number j. Then, a rightward rotation with a length j is applied to the permutation field. Finally, a Gray decoding is carried out on the r less significant bits of the permutation field, and this gives a whole number x'. The whole number sought is then equal to $x'+j.2^r$.

Taking up the above example, if it is desired to decode the code constituted by the bits '101000', the procedure starts with the decoding of the reference field, equal to '10', which gives j=2. A rightward rotation with a length 2 is then applied to the permutation field, equal to '1000', which gives '0010'. The sub-field '10' is then decoded according to a Gray code on two bits, which gives y=3. The whole number encoded by the initial counting field was therefore $3+2.2^2=11$. The standard binary decomposition $h_4h_3h_2h_1$ of this whole number is obtained by preserving the two more significant bits, namely '10' and in applying a conversion from the Gray code into the standard binary code to the field '10', which gives '11' or '1011' in all.

The incrementation and decrementation methods described here above are also applicable to this first variant.

Second variant of the Invention

The second variant of the invention presented can be applied more particularly to the case where a counter designed to undergo several cycles is encoded, with the possibility, if necessary, of interruption at each cycle.

This variant is described here below with reference to a case where n is a power of 2 ($n=2^r$). Every operation can be reduced to this case in replacing n by the smallest whole number having the form $2^k$ that is greater than or equal to it.

Each whole number x is encoded by means of a field C(x) of r+q binary elements called an x code or encoding. This field is subdivided into two sub-fields: a so-called reference field, constituted by q bits, and a so-called permutation field, constituted by r bits and located to the right of the reference field.

In an advantageous use of this invention, we have the equality $r=2^q$. Thus, when $r=1,2,3,4,5, \ldots$, then $r=2,4,8,16,32, \ldots$ and $n=4,16,256,16384,2^{32}, \ldots$ The two essential characteristics of this variant are the same as for the basic invention. The notations are also the same. The whole number to be encoded is called x.

When the counter goes through a cycle for the first time, the reference field is taken as being equal to $C_q(0)$, and the permutation field as equal to $G_r(X)$.

When the counter goes through a cycle for the second time, the reference field is taken as being equal to $C_q(1)$, and the permutation field as equal to $G_r(x)$. Then a leftward rotation with an amplitude of 1 is applied to the permutation field, i.e. if the permutation field was equal to $g_r g_{r-1} \ldots g_1$ before the rotation, it becomes $g_{r-1} \ldots g_1 g_r$ after the rotation.

More generally, when the counter undergoes a cycle for the (j+1)th time, the reference field is taken as being equal to $C_q(j)$ (should j be greater than or equal to r, then j will be first of all be replaced by the rest of the division of j by r) and the permutation field equal to $G_r(x)$. Then, a leftward rotation with an amplitude j is applied to the permutation field, i.e. if the permutation field was equal to $g_r g_{r-1} \ldots g_1$ before the rotation, it becomes $g_{r-j} \ldots g_1 g_r \ldots g_{r-j+1}$ after the rotation.

As an example, we present the case where n=16, r=4 and q=2 and where $C_2$ is the standard binary encoding on two bits. We thus obtain the following table:

TABLE 3

| | x | standard binary encoding | encoding according to the second variant |
|---|---|---|---|
| First cycle | 0 | 0 0 0 0 | 0 0 0 0 0 0 |
| | 1 | 0 0 0 1 | 0 0 0 0 0 1 |
| | 2 | 0 0 1 0 | 0 0 0 0 1 1 |
| | . | . | . |
| | . | . | . |
| | . | . | . |
| | 15 | 1 1 1 1 | 0 0 1 0 0 0 |
| Second cycle | 0 | 0 0 0 0 | 0 1 0 0 0 0 |
| | 1 | 0 0 0 1 | 0 1 0 0 1 0 |
| | 2 | 0 0 1 0 | 0 1 0 1 1 0 |
| | . | . | . |
| | . | . | . |

TABLE 3-continued

| | x | standard binary encoding | encoding according to the second variant |
|---|---|---|---|
| | . | . | . |
| | 15 | 1 1 1 1 | 0 1 0 0 0 1 |
| Third cycle | 0 | 0 0 0 0 | 1 0 0 0 0 0 |
| | 1 | 0 0 0 1 | 1 0 0 1 0 0 |
| | 2 | 0 0 1 0 | 1 0 1 1 0 0 |
| | . | . | . |
| Fourth cycle | . | . | . |
| | 14 | 1 1 1 0 | 1 1 1 1 0 0 |
| | 15 | 1 1 1 1 | 1 1 0 1 0 0 |

To decode a whole number encoded by the method that has just been described, the procedure starts with a decoding of the reference field. This gives a whole number j. Then, a rightward rotation with a length j is applied to the permutation field. Finally, a Gray decoding is carried out on k bits of the permutation field, and this gives a whole number x.

Taking up the above example, if it is desired to decode the code constituted by the bits '101000', the procedure starts with the decoding of the reference field, equal to '10', which gives j=2. A rightward rotation with an amplitude 2 is then applied to the permutation field, equal to '1000', which gives '0010'. This field is then decoded according to a Gray code on four bits, which gives x=3. The whole number encoded by the initial counting field was therefore 3.

Thus, in this second variant, the value contained in the permutation field corresponds directly to the value of the counter, and the value contained in the reference field contains the number of cycles undergone by the counter.

If it is desired to interrupt a given cycle and/or reset a counter at zero, then the reference field is incremented and all the bits of the permutation field are taken as being equal to zero.

The methods of incrementation and decrementation described can be applied to this second variant of the invention.

What is claimed is:

1. A method for prolonging lifetime of a set of binary elements of a memory unit, the set of binary elements being configured for storage of digital data elements, said method comprising a step of defining a reference field and a permutation field in said set of binary elements, and for each of said digital data elements to be stored, said method comprises the steps of:

associating with said digital data element a first and a second sequence of binary elements, according to a reversible mathematical function, assigning the first sequence of binary elements to the reference field, conducting a permutation of the binary elements of the second sequence of binary elements as a function of the first sequence of binary elements to form a permuted second sequence of binary elements, and assigning the permuted second sequence of binary elements to the permutation field.

2. A method according to claim 1, wherein said conducting step comprises a step of performing a rotation of the binary elements of said second sequence, the amplitude of the rotation being a function of the first sequence of binary elements.

3. A method for inducing a substantially uniform mean change rate for each binary element of a set of binary elements of a memory unit, said set of binary elements being configured for successive storage of digital data elements, wherein the storage of a digital data element having a value N comprises the following steps:

defining two distinct encoding fields of binary elements, namely, a reference field and a permutation field, said permutation field comprising a sufficient number of binary elements to permit a natural binary encoding of a number $n_R$ of distinct integer values;

determining by Euclidian division of said value N by said number $n_R$ an integer quotient of value Q with an integer remainder of value R;

computing a first sequence of binary elements corresponding to said value Q according to a first encoding logic;

computing a second sequence of binary elements corresponding to said value R according to a second encoding logic;

conducting an encoding permutation of the binary elements of said second sequence of binary elements as a function of said value Q, to form a permuted second sequence of binary elements;

assigning said first sequence of binary elements to said reference field; and assigning said permuted second sequence of binary elements to said permutation field.

4. A method according to claim 3 wherein said step of conducting an encoding permutation comprises conducting a rotation having an amplitude $A_Q$ as a function of said value O.

5. A method according to claim 4, wherein said rotation consists of a rotation having an amplitude Q.

6. A method according to claim 3, wherein, in said step of computing said second sequence of binary elements, said second encoding logic comprises a minimum-change code which performs the step of inducing a change in a minimum number of binary elements in said permutation field during passage from one of said digital data elements to a subsequent digital data element and from a preceding digital data element.

7. A method according to claim 6, wherein said minimum-change code comprises a Gray code.

8. A method according to claim 3, wherein said step of computing a second sequence of binary elements comprises the following steps:

associating a sequence of binary elements with said value R to form an associated sequence; and concatenating at least one binary element of a fixed value with said associated sequence.

9. A method according to claim 3, comprising the following steps:

determining said value Q from said first sequence of binary elements contained in said reference field according to a reverse of said first encoding logic;

performing a decoding permutation depending on said value Q of said second sequence of binary elements contained in said permutation field, said decoding permutation being the reverse of said encoding permutation;

incrementing according to said second encoding logic the sequence of binary elements obtained after said decoding permutation to form an incremented sequence of binary elements;

if the value, according to said second encoding logic, of said incremented sequence of binary elements corresponds to the first data element of said sequence of data elements, then incrementing according to said first encoding logic the sequence of binary elements contained in said reference field and determining the corresponding incremented value Q; and performing a decoding permutation depending on said value Q of said incremented sequence of binary values contained in said permutation field.

10. A method according to claim 3, comprising the following steps:

determining said value Q from said first sequence of binary elements contained in said reference field, according to a reverse of said first encoding logic;

performing a decoding permutation depending on said value Q of said second sequence of binary elements contained in said permutation field, said decoding permutation being the reverse of said encoding permutation;

decrementing according to said second encoding logic the sequence of binary elements obtained after said decoding permutation to form a decremented sequence of binary elements;

if the value according to said second encoding logic of said decremented sequence of binary elements corresponds to the last data element of said sequence of data elements, then decrementing according to said first encoding logic the sequence of binary elements contained is said reference field, and determining the corresponding decremented value Q; and performing an encoding permutation depending on said value Q of said decremented sequence of binary values contained in said permutation field.

11. A method according to claim 3 wherein, in said step of computing a first sequence of binary elements, said first encoding logic comprises a minimum-change code, inducing a change in a minimum number of binary elements in said reference field during the passage from one of said data elements to a next data element, and from any preceding data elements.

12. A method according to claim 11, wherein said minimum-change code comprises a Gray code.

13. A method for inducing a substantially uniform mean change rate for each binary element of a set of binary elements of a memory unit, said set of binary elements being configured for successive storage of digital data elements, the method comprising the steps of:

arranging the digital data elements to be stored to form a finite sequence of values changing sequentially, defining two distinct encoding fields of binary elements in said set of binary elements, namely, a reference field and a permutation field, and for each digital data element to be encoded, performing the steps of:

associating with said digital data element to be encoded a first and a second sequence of binary elements according to a reversible mathematical function, assigning the first sequence of binary elements to the reference field, conducting a permutation of the binary elements of the second sequence of binary elements as a function of the first sequence of binary elements to form a permuted second sequence of binary elements, and assigning the permuted second sequence of binary elements to the permutation field, and selecting a next digital data element from said finite sequence of values.

14. A method according to any of the claims 1, or 13, wherein said associating step comprises a step of encoding said first sequence of binary elements according to a minimum-change code to induce a change in a minimum number of binary elements in said reference field.

15. A method according to claim 14 wherein said minimum-change code comprises a Gray code.

16. A method according to any of the claims 1, or 13, wherein said associating step comprises the step of encoding said second sequence of binary elements according to a minimum-change code to induce a change in a minimum number of binary elements in said permutation field.

17. A method according to claim 16 wherein said minimum-change code comprises a Gray code.

18. A method for prolonging lifetime of a set of binary elements of a memory unit, the set of binary elements being configured for storage of digital data elements, the set of binary elements being designed to undergo an encoding cycle upon storage of each of said digital data elements, comprising the steps of:

defining two distinct fields of binary elements, namely, a reference field and a permutation field, associating with each encoding cycle a number m representing the number of encoding cycles undergone by said set of binary elements, the number m being expressed as a first sequence of binary elements according to a first reversible mathematical function, associating with each of said digital data elements a second sequence of binary elements according to a second reversible mathematical function.

assigning the first sequence of binary elements to the reference field, conducting a permutation of the binary elements of said second sequence of binary elements as a function of the first sequence of binary elements to form a permuted second sequence of binary elements, allocating the permuted second sequence of binary elements to the permutation field.

19. A method according to claim 18, further comprising the steps of:

incrementing said first sequence of binary elements in said reference field to correspond to the number m+1 representing the number of cycles undergone, and assigning to said permutation field a sequence of binary elements corresponding to the first data element of said sequence of data elements according to said second reversible mathematical function.

20. A method according to any of the claims 1, 13, or 18 wherein said digital data elements include n distinct data elements and wherein said step of defining the reference and permutation fields comprises the steps of:

providing said reference and permutation fields respectively comprising q binary elements and r binary elements, wherein q and r are both integers chosen such that the following conditions are met simultaneously:

the total number of binary elements (q+r) of the reference field and of the permutation field is equal to or greater than the number of binary elements needed for encoding of said n distinct data elements according to natural binary encoding, and said value r is smaller than or equal to $2^q$.

21. A method according to claim 18 wherein said associating step comprises a step of encoding said first sequence of binary elements according to a minimum-change code to induce a change in a minimum number of binary elements in said reference field.

22. A method according to claim 18 wherein said allocating step comprises the step of encoding said second sequence of binary elements according to a minimum-change code to induce a change in a minimum number of binary elements in said permutation field.

23. An apparatus for storing a value N belonging to a predetermined set of values, the apparatus comprising:

a memory unit comprising a plurality of degradable binary elements and including two distinct encoding fields of binary elements, namely, a reference field and a permutation field, said permutation field comprising a sufficient number of binary elements to permit natural binary encoding of a number $n_R$ of distinct integer values;

means for determining by Euclidian division of said value N by said number $n_R$ an integer quotient of value Q with an integer remainder of value R;

means for computing a first sequence of binary elements corresponding to said value Q according to a first encoding logic;

means for computing a second sequence of binary elements corresponding to said value R according to a second encoding logic;

means for conducting an encoding permutation of the binary elements of said second sequence as a function of said value Q, to form a permuted second sequence of binary elements;

means for assigning said first sequence of binary elements to said reference field; and means for assigning said permuted second sequence of binary elements to said permutation field.

24. An apparatus for storing a data element belonging to a predetermined set of data elements, the apparatus comprising:

a memory unit comprising a plurality of degradable binary elements and including two distinct encoding fields of binary elements, namely, a reference field and a permutation field, means for associating with each digital data element to be stored a first and a second sequence of binary elements, according to a predetermined reversible mathematical function, means for assigning the first sequence of binary elements to the reference field, means for conducting a permutation of the binary elements of the second sequence of binary elements as a function of the first sequence of binary elements to form a permuted second sequence of binary elements, and means for assigning the permuted second sequence of binary elements to the permutation field.

* * * * *